United States Patent [19]
Lorenz et al.

[11] Patent Number: 5,135,349
[45] Date of Patent: Aug. 4, 1992

[54] ROBOTIC HANDLING SYSTEM

[75] Inventors: Karl Lorenz, Redwood City; John H. Sutton, San Carlos; William J. Stone, III, Cupertino, all of Calif.

[73] Assignee: Cybeq Systems, Inc., Menlo Park, Calif.

[21] Appl. No.: 525,131

[22] Filed: May 17, 1990

[51] Int. Cl.⁵ ............................................. B25J 9/04
[52] U.S. Cl. .................... 414/744.6; 414/744.3; 414/225; 414/416; 414/DIG. 3
[58] Field of Search ............... 414/744.2, 744.3, 744.6, 414/752, 416, 225, DIG. 3; 901/17, 21, 40

[56] References Cited

U.S. PATENT DOCUMENTS

| | | | |
|---|---|---|---|
| 4,319,864 | 3/1982 | Kaufeldt | 901/21 X |
| 4,699,559 | 10/1987 | Bibbo et al. | 414/752 |
| 4,735,548 | 4/1988 | Kimata et al. | 414/744.3 |
| 4,770,590 | 9/1988 | Hugues et al. | 414/744.3 X |
| 4,871,290 | 10/1989 | Kaczynski et al. | 414/744.3 X |

FOREIGN PATENT DOCUMENTS

| | | | |
|---|---|---|---|
| 2553327 | 4/1985 | France | 414/744.6 |
| 255105 | 11/1987 | Japan | 901/40 |
| 183384 | 7/1989 | Japan | 901/21 |
| 1085806 | 4/1984 | U.S.S.R. | 414/744.6 |

*Primary Examiner*—Robert J. Spar
*Assistant Examiner*—William M. Hienz
*Attorney, Agent, or Firm*—Flehr, Hohbach, Test, Albritton & Herbert

[57] ABSTRACT

A robotic handling system is described that includes a support column aligned along a vertically aligned Z axis with a dual-wand assembly rotatably mounted atop the support column and defining a 'reach' or R axis. Drive motor/encoder assemblies are mounted adjacent the support column for raising or lowering the dual-wand assembly along the Z axis and mounted within the support column for slewing the dual-wand assembly to any selected $\theta$ angle within the range of operation under the control of a stored program processor.

4 Claims, 15 Drawing Sheets

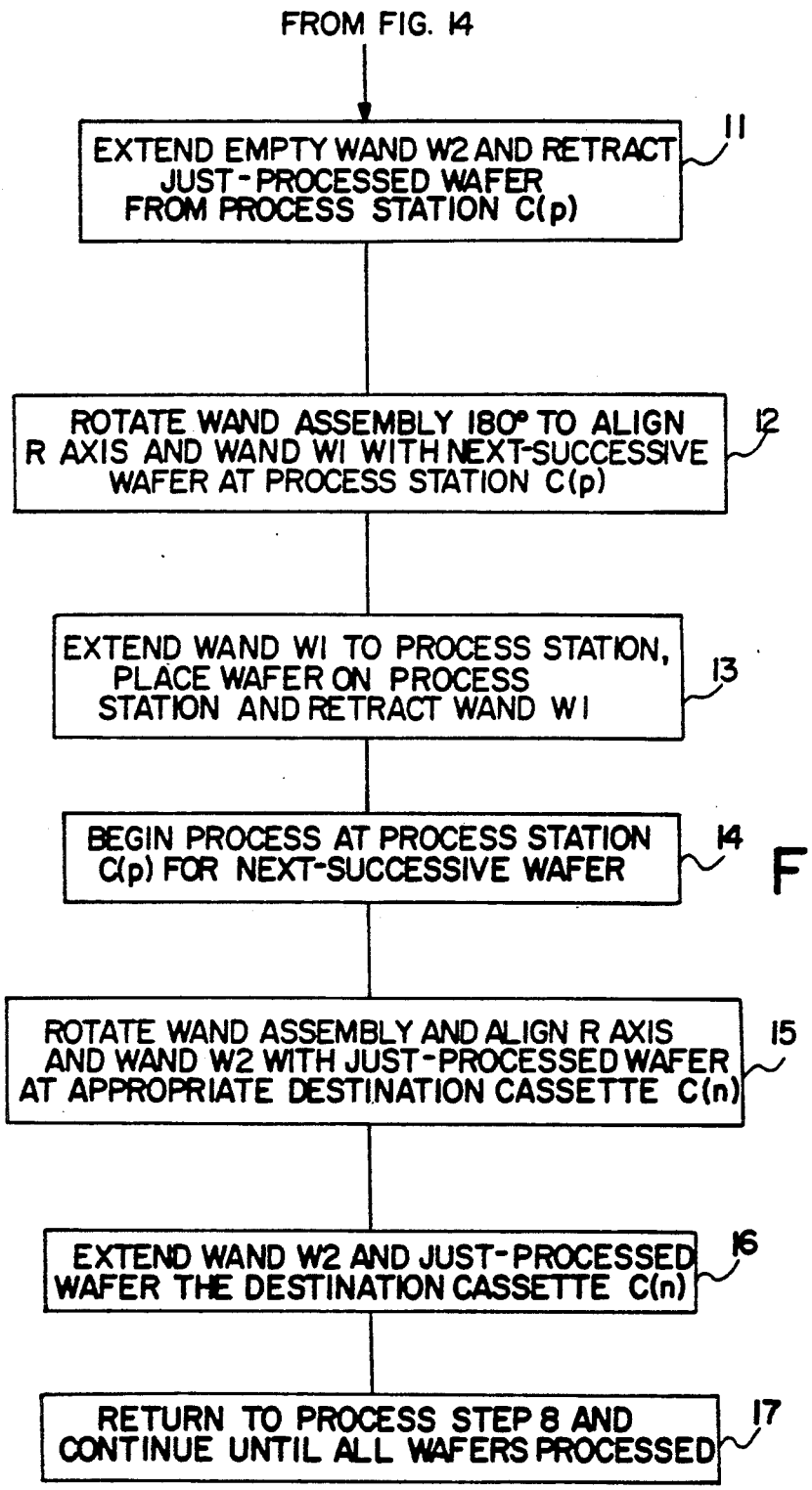

ROBOTIC HANDLING SYSTEM

BACKGROUND OF THE INVENTION

The present invention relates to robotic handling systems and, more particularly, to robotic handling systems used in the semiconductor fabrication industry for transporting and transferring semiconductive workpieces, such as semiconductor wafers.

In the semiconductor fabrication industry, a series of discoidal wafers are cut from a starting monocrystalline boule and processed through numerous steps to provide circuit patterns on the surface of each wafer. As a general rule, the processing of the wafers is carried out in a step-wise manner, that is, the wafers are transferred one at a time from one discrete process step to the next. To this end, it is common to store groups of wafers in standard-configuration cassettes. The wafers stored in a supply cassette can be removed one at a time, subjected to one of many process steps, and inserted into the same or another cassette. The cassettes retain the wafers in a spaced, parallel relationship so that insertion or removal of a wafer requires moving the wafer in a direction parallel to its medial plane as it is inserted or removed from its cassette.

Since cleanliness is critical to the successful processing of the wafers and since a large number of steps are usually involved, the opportunities for particulate contamination of the wafers are particularly high with regard to those phases of the overall process that involve the removal and insertion of the wafers into their cassettes and the transfer of the wafers from one process step or work station to another. In an effort to reduce both the opportunity for wafer contamination and the labor costs involved in the handling of the wafers, various types of robot handling systems have been developed for removing a succession of wafers from a supply cassette, transporting the wafers to a work station where they are subjected to some type of processing step, and transporting the processed wafers to a receiving cassette with the wafers subjected to a succession of such removal, transporting, processing, transporting, and insertion cycles.

The robot systems typically operate in a three-dimensional coordinate system that includes a vertically aligned Z axis and an orthogonal, horizontally aligned operating axis, also termed the R or 'reach' axis. The R axis is rotatable about the Z axis at an angle $\theta$. A representative robot system includes a column aligned along the Z axis and having a horizontally aligned wand assembly mounted atop the column. A motor or other actuator in the column elevates the wand assembly to a selected elevation within its range of elevation. The wand assembly is rotated about the Z axis to any desired $\theta$ angle by another motor or actuator. A thin, spatula-like wand, also termed an 'end effector,' is mounted on a guideway in the wand assembly for bi-directional linear movement on the guideway along the R axis between retracted and extended positions.

In a typical application, three or more wafer cassettes and a work station, such as a visual inspection station, are positioned within the area swept by the extended wand. A controller slews or rotates the wand assembly about the Z axis to an angle $\theta_s$ corresponding to the position of the wafer supply cassette and elevates the wand assembly to the proper elevation. The wand is then extended along the R axis to be placed beneath the first wafer to be inspected. The wand is elevated to contact the underside of the wafer as a vacuum system is enabled to pneumatically engage the underside of such first wafer. The wand is then retracted to remove this first wafer from the supply cassette. When the first wafer is clear of the supply cassette, the wand assembly is rotated from its initial position $\theta_s$ at the supply cassette to the $\theta_i$ corresponding position of the inspection station. The elevation of the wand assembly is varied along the Z axis, as appropriate, to correspond to the elevation of the inspection station, and the wand and the first wafer are extended to the inspection station where the vacuum system is inhibited and the wafer released for inspection. The wand is retracted during the inspection step and waits during a dwell period while the inspection is performed. After the inspection is completed, the wand is extended along the R axis to retrieve the wafer. In a typical post-inspection sequence, the inspected wafer is either provided to an 'accepted-wafer' cassette for further processing or to a 'rejected-wafer' cassette for reprocessing. Depending upon the disposition of the inspected wafer, the wand assembly is rotated to a $\theta$ position corresponding to an 'accepted-wafer' cassette, i.e., $\theta_a$, or to a $\theta$ position corresponding to a 'rejected-wafer' cassette, i.e., $\theta_r$, and the elevation of the wand assembly raised or lowered to the proper elevation. The wand is then extended to deposit the just-inspected wafer in the proper destination cassette. These process steps are repeated on a recurring cyclic basis with the throughput of the robot limited by the maximum linear acceleration and rotary slew rates that the wafer can be subjected to without diminishing the reliable and safe transportation of the wafer to and from the various cassettes and the work station.

Efforts have been made to increase the throughput by providing a single-piece dual wand on the wand assembly with the wands aligned in a 60° to 110° range, for example, relative to one another. The wands are controlled by an additional rotary actuator so that one arm or the other can be co-aligned along the R axis and advanced or retracted along the R axis in the usual manner. It should be noted that the arms do not move independently of one another. That is, movement of one arm causes a corresponding movement of the other arm because of the single-piece construction. Thus, care has to be taken in designing uses of the same to assure that a desired movement of one arm does not result in undesirable movement of the other arm. Moreover, certain movements simply cannot be made. And while the dual-wand approach does increase throughput, it undesirably positions the required additional rotary actuator above the plane of the wafer and subjects the wafer surface to any particulate contaminants shed by the actuator over its operating life.

It will be recognized from the above that a robot system of the nature being described requires relatively complex equipment made up of actuators, drives, etc., to effect the desired operations. This has resulted in such robot systems being somewhat cumbersome.

SUMMARY OF THE INVENTION

In view of the above, it is an object of the present invention, among others, to provide a robotic handling system having increased workpiece throughput compared to prior systems.

It is another object of the present invention to provide a robotic handling system having a compact overall operating envelope while providing increased throughput and operating flexibility.

In view of these objects, and others, the present invention provides a robotic handling system in which end effectors are mounted on spaced, parallel axes and are independently actuatable along the R axis to effect engagement of a semiconductive workpiece, such as a semiconductor wafer, and transfer it between locations while also engaging the next successive workpiece to be transferred. The robotic handling system includes a support column aligned along the Z axis with a wand assembly rotatably mounted relative to the support column and generally aligned in a collinear manner with the R axis so that the wand assembly can be moved to any selected $\theta$ angle within its range of operation under the control of a suitable rotary actuator. A plurality of separate drives are provided for moving the support column along the Z axis. These drives are offset from such axis to free the interior of the column. In this connection, the column most desirably is a hollow cylinder and its interior is free to carry the mechanisms necessary to drive the wand assembly. A coupling between the separate Z axis drives and the column accommodates the application of differing forces to the column by the individual drives.

The wand assembly includes at least two guideways or their functional equivalent with a carrier mounted upon or in engagement with each of the guideways. Respective wand-like end effectors are connected to a corresponding carrier. Each has a portion thereof aligned on or along the R axis for selectively engaging and disengaging a workpiece. Respective carrier drives are provided to allow independent extension and retraction of each end effector.

In the preferred embodiment, the robotic handling system includes a support column aligned along the Z axis with the dual-wand assembly rotatably mounted on it. A plurality of drive assemblies are mounted adjacent the support column for raising or lowering the dual-wand assembly along the Z axis. These drive assemblies include a pair of lead screw arrangements mounted respectively on opposite sides of the support column. Such lead screws are connected together by a bridge which not only extends between the same but also extends across the Z axis. The coupling includes a connector between the bridge and the support column designed to provide the accommodation of differential application of forces described above.

The support column is a hollow cylinder and actuator assemblies are mounted within the support column for slewing the dual-wand assembly to any selected $\theta$ angle within the range of operation under the control of a stored program controller. Two spaced apart and substantially parallel guide rails are provided on the dual-wand assembly with a carrier slidably engaging each rail. A wand designed for the vacuum engagement of semiconductor wafers is attached to each carrier to provide a pair of wands extending in opposite directions along the R axis. Independently operable carrier actuators are provided to allow independent extension and retraction of each wand and its end effector along the R axis or along an axis that is adjacent to the R axis.

The various actuators can take the form, for example, of motor/encoder units driving various types of ball/lead screw arrangements with various types of mechanical or electrical stops to limit movement. The carrier actuators preferably take the form of flexible bands or wires entrained about spaced drive and idler capstans with the carrier secured to its band so that bi-directional rotation of the drive capstan will cause corresponding bi-directional linear motion of the wand and end effector along the R axis.

Since the robotic handling system of the present invention provides plural end effectors that are independently operable along a common axis, it is possible to provide more flexibility in designing wafer transport schemes than has been available. For example, it is possible to accomplish several functions simultaneously, e.g., it is possible to rotate a wafer from a work station to one of several receiving cassettes while concurrently rotating the next successive wafer from a source cassette to the work station, to thereby increase the throughput compared to prior systems. Moreover, the robotic handling system of the invention is faster than those provided in the past, especially when it is used in vacuum systems where vacuum cannot be used to hold a wafer in position on an end effector. That is, since the two end effectors are independently movable, the speed of translational motion of an end effector not having a wafer is not affected by the presence of a wafer on the other end effector.

The present invention advantageously provides a reliable robotic handling system having increased throughput and design flexibility in a desirably reduced-size operating envelope, with lower manufacturing and maintenance costs.

Other objects and further scope of applicability of the present invention will become apparent from the detailed description to follow, taken in conjunction with the accompanying drawings, in which like parts are designated by like reference characters.

BRIEF DESCRIPTION OF THE DRAWINGS

FIGS. 14 and 14A are a functional flow diagram illustrating a first, preferred sequence of operation of the robotic handling system in the context of FIG. 5;

DESCRIPTION OF THE PREFERRED EMBODIMENT

Figure 1:
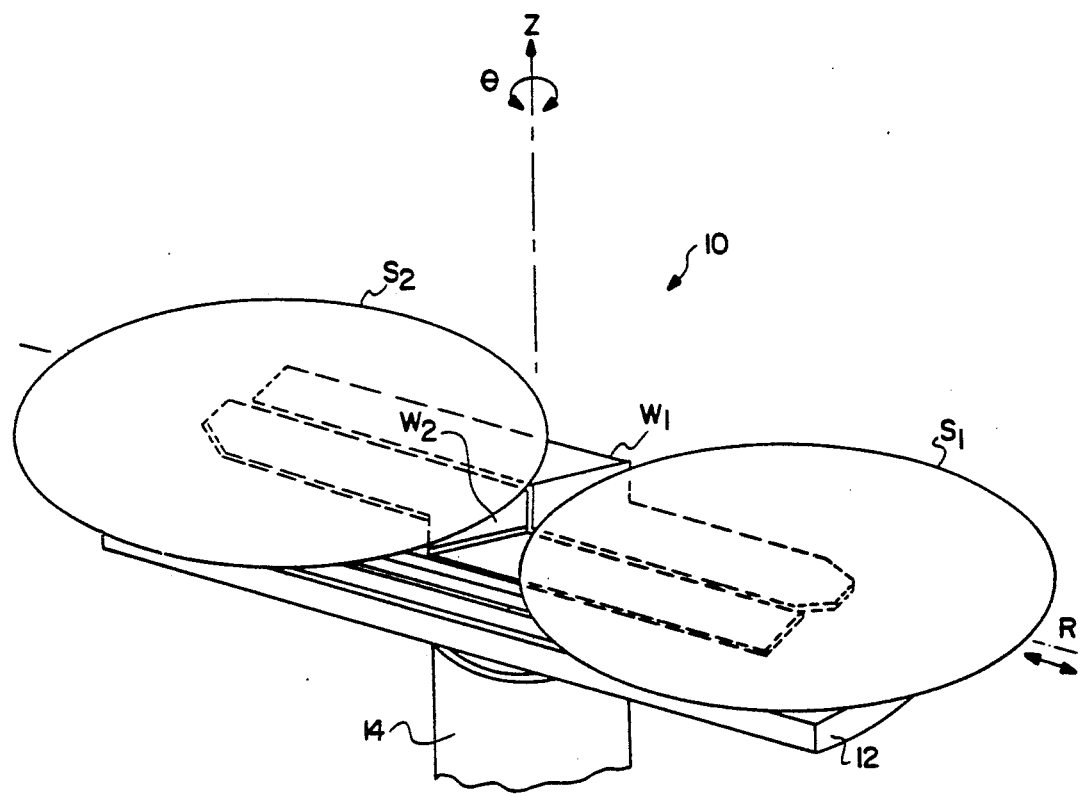
FIG. 1 is a partial perspective view of a wand assembly of the robotic handling system in accordance with the present invention and illustrating first and second exemplary semiconductor wafers mounted upon retracted wands.
Figure 2:
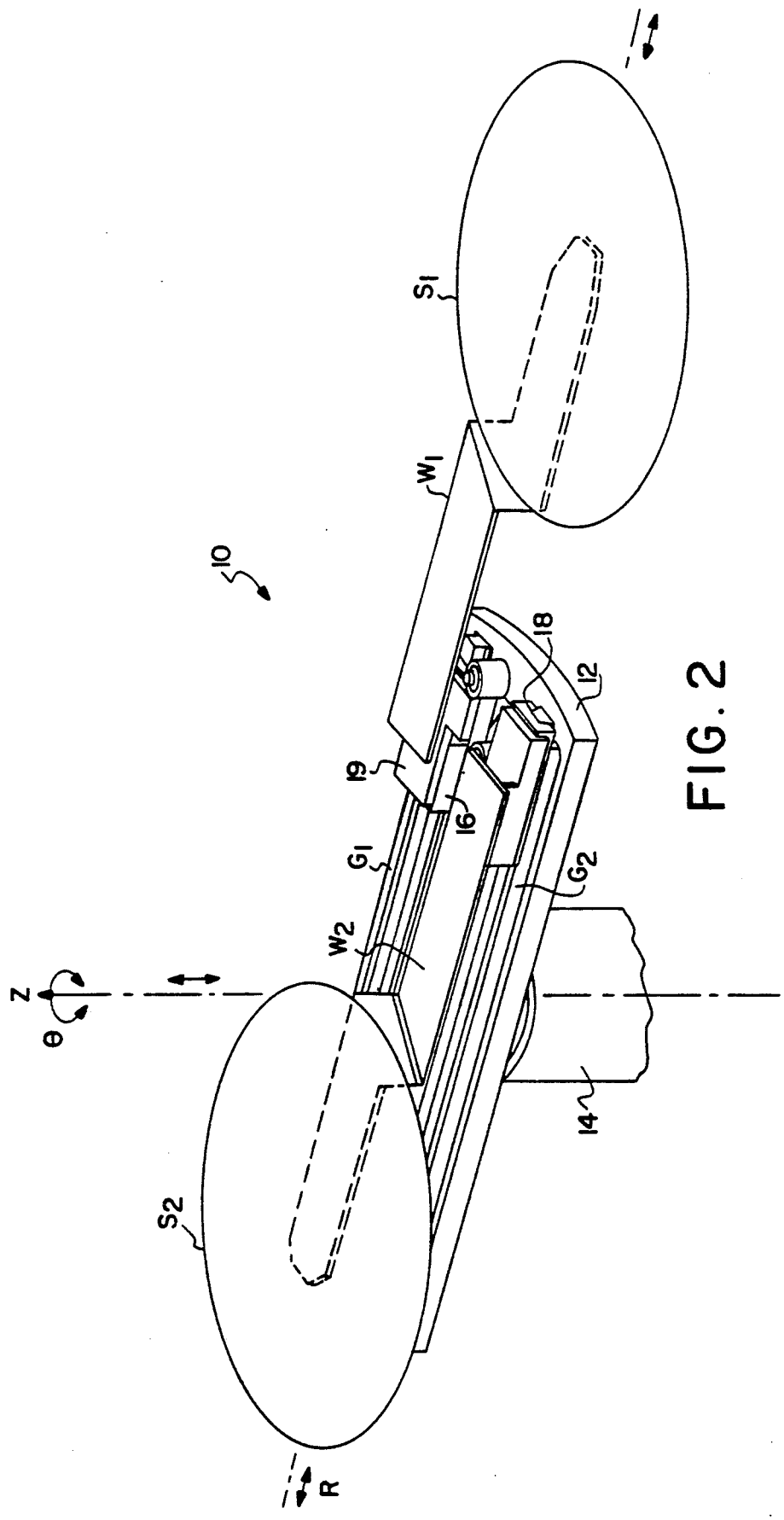
FIG. 2 is a partial perspective view of the wand assembly of FIG. 1 illustrating a first wand in an extended position along a reach axis.
Figure 3:
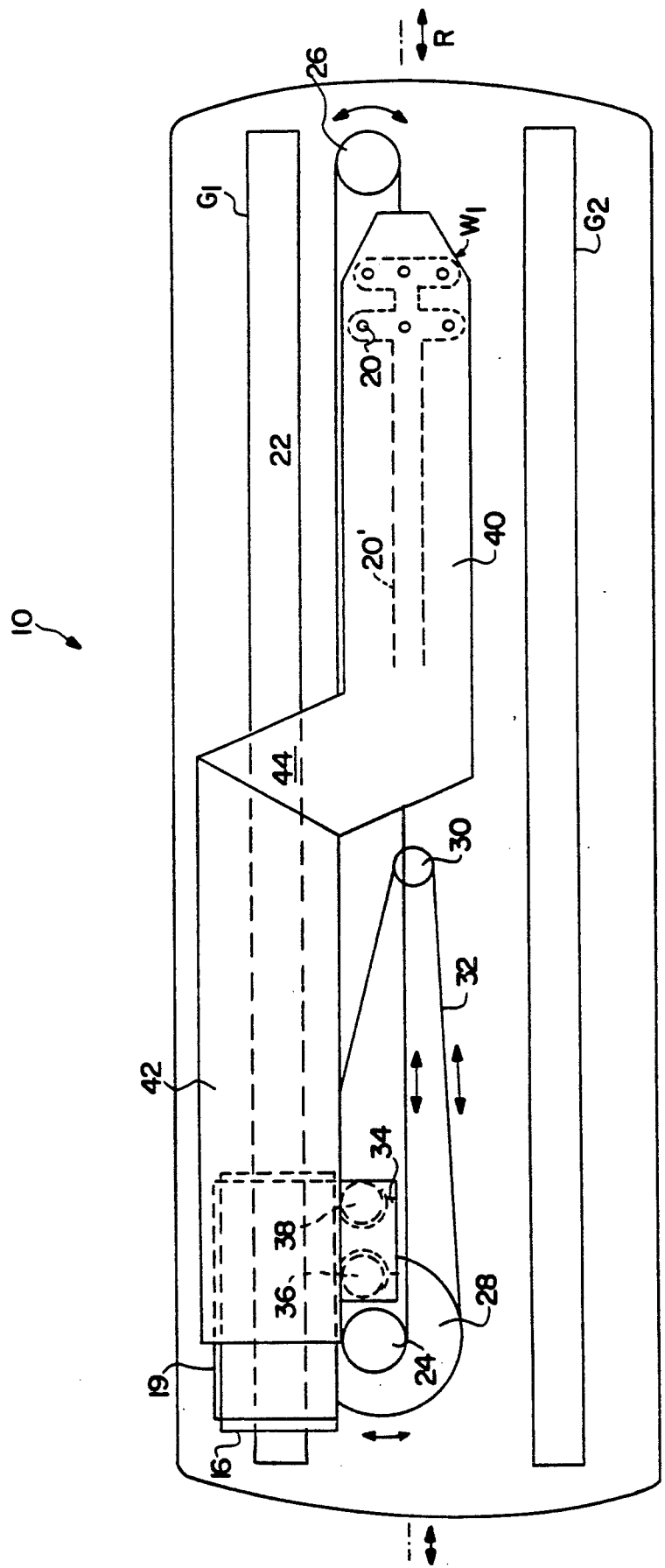
FIG. 3 is a top view of the wand assembly of FIG. 1 and with selected components omitted for reasons of clarity.

A wand assembly portion of a robotic handling system in accordance with the present invention is shown in partial perspective view in FIGS. 1 and 2, and in top view in FIG. 3. It is designated generally in these figures by the reference character 10. As shown in FIGS. 1 and 2, the wand assembly 10 is designed to handle and transport thin, disc-like semiconductor wafers $S_1$ and $S_2$ within a coordinate system that includes a Z axis that is generally vertically aligned and a perpendicularly aligned horizontal 'reach' axis R. As explained more fully below, the wand assembly 10 is rotatable about the Z axis and movable along the Z axis to change the relative elevation of the wand assembly 10. The wand assembly 10 includes first and second wands $W_1$ and $W_2$ that are mounted upon guideways (unnumbered in FIGS. 1 and 2) carried upon a base plate 12 and are independently moveable along the R axis to handle and transport the wafers $S_1$ and $S_2$ from source cassettes or work stations to destination cassettes or work stations (not specifically shown). In FIG. 1, the wands $W_1$ and $W_2$ are shown in their fully retracted or home positions, and, in FIG. 2, wand $W_1$ is shown in its fully extended position. Since the wand assembly 10 is rotatable about the Z axis, as explained more fully below, the extended wands $W_1$ and $W_2$ will sweep a generally circular area. In general, all work stations or wafer supply and destination cassettes are positioned within the ambit of the swept area so that the wands $W_1$ and $W_2$ can effect efficient handling and transfer of the wafers $S_1$ and $S_2$. It should be noted that the effective reach of the individual wands is greater than the reach would be if a single wand with opposed end effectors was used. That is, with the present invention the guideways for the two individual wands are adjacent laterally to one another.

As shown in the perspective view of FIG. 2 and the partial top view of FIG. 3, the base plate 12 is mounted at its mid-point atop a support column 14 and includes, on its upper surface, first and second guide rails G1 and G2 that are formed as rectangular parallelepipeds and are spaced from and generally parallel to the R axis. The guide rail G1 carries and guides the wand $W_1$ as it is moved between its initial and extended positions, and, similarly, the guide rail G2 carries and guides the wand $W_2$ as it is moved between its initial and extended positions. A carrier block 16 is provided on each of the guide rails G1 and G2 with each carrier block 16 including a groove 18 (FIG. 2) on its underside and a precision anti-friction bearing (not shown) that engages its respective guide rail. If desired, the guide rails G1 and G2 can be defined by cylindrical shafts and the carrier blocks 16 can be defined by various types of anti-friction bearings including recirculating-ball bearings journalled to the shafts. Such block 16 also can be covered by a plate 19. The proximate ends of the wands $W_1$ and $W_2$ are secured to their respective carrier blocks 16 by suitable fasteners (not specifically shown).

The remote ends of the wands $W_1$ and $W_2$ are provided with vacuum ports, such as the exemplary array of holes 20 in FIG. 3, which communicate via internal passageways 20' (dotted line illustration) in the wands $W_1$ and $W_2$ to ports (not shown) formed in the carrier blocks 16. These latter ports are connected to a selectively operable vacuum source (not shown in FIG. 3) via appropriate hoses or tubing. The vacuum source can be selectively enabled or inhibited to pneumatically attach and detach the wafers $S_1$ and $S_2$ to their respective wands $W_1$ and $W_2$ as is known in the art.

Figure 13:
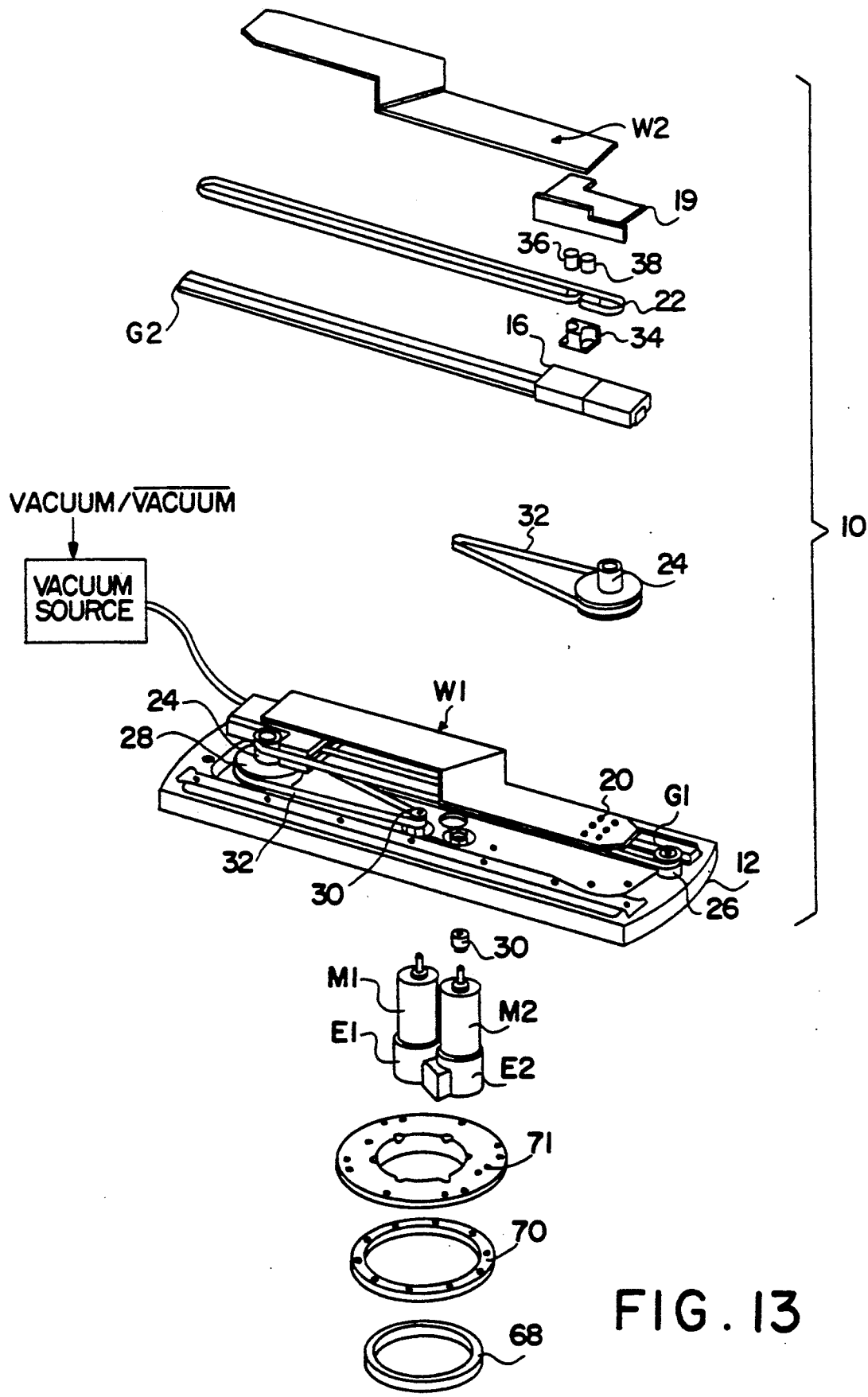
FIGS. 13 and 13A are sequential exploded perspectives of the robotic handling system.
Figure 13A:
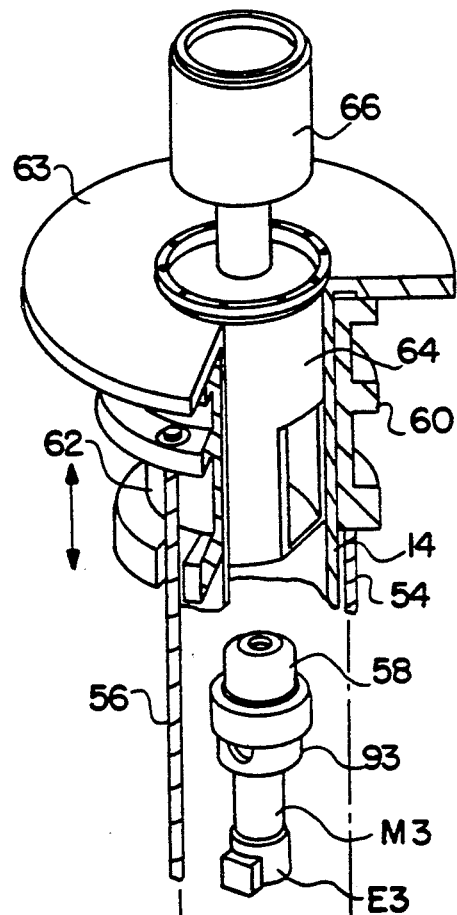
Figure 13A:
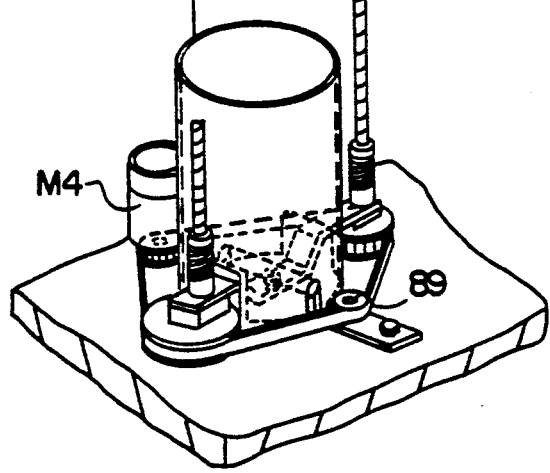
Figure 16:
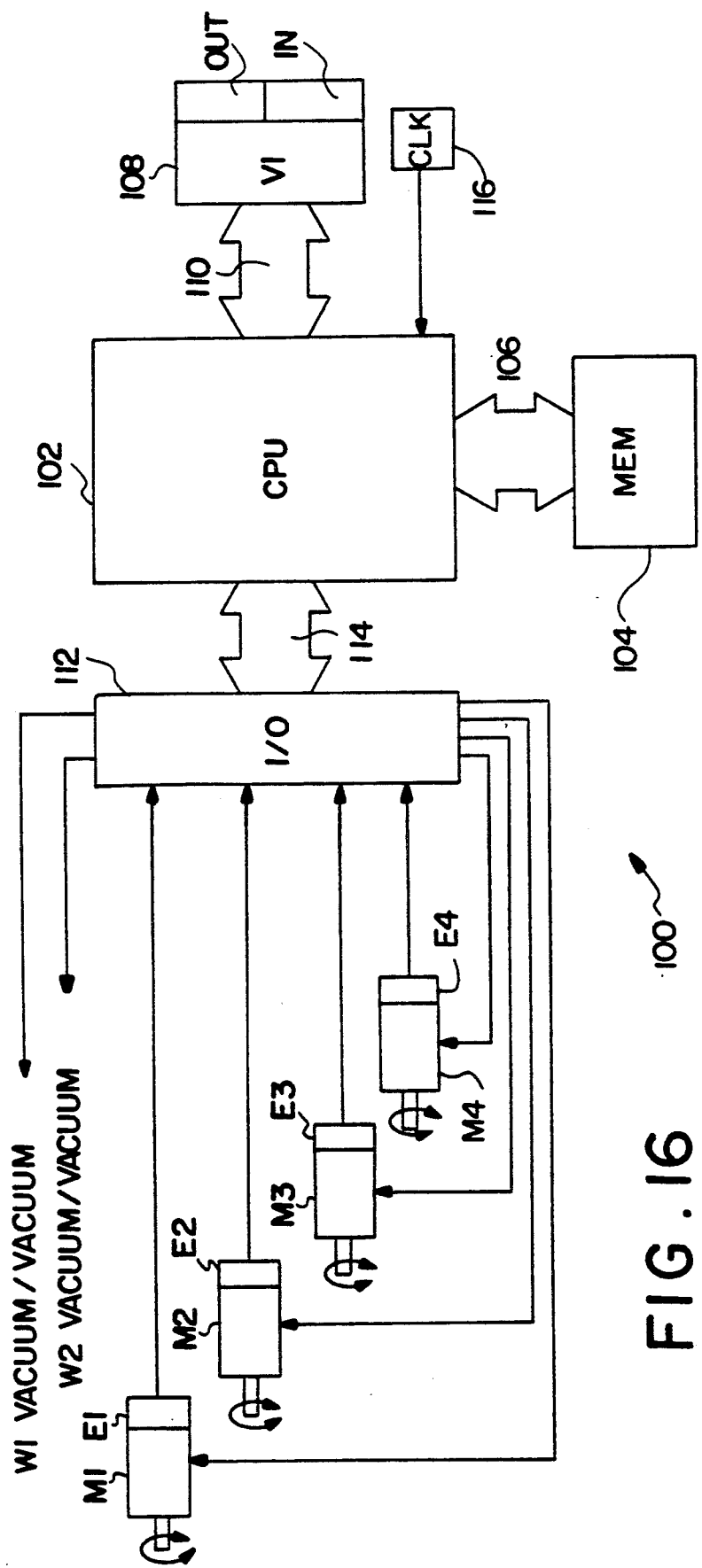
FIG. 16 is a schematic block diagram of a microprocessor controller that functions in accordance with the flow diagrams of FIGS. 14 and 14A and/or FIGS. 15 and 15A.

The wands $W_1$ and $W_2$ are selectively advanced from their home position to their extended position and retracted by a mechanical drive train shown in FIGS. 2 and 3 under the control of a controller described more fully below in relationship to FIG. 16. As shown in FIG. 3, a carrier band 22 is entrained about a rotatably mounted capstan 24 at one end of the base plate 12 and a rotatably mounted idler 26 at the other end of the base plate 12. The carrier band 22 is preferably fabricated from a flexible though inextensible material, such as a glass-filled elastomer, or fabricated as a thin metal band. A driven pulley 28 is secured to the rotatably mounted capstan 24 and is coupled to a drive pulley 30 through a drive belt 32 that is entrained about both the drive pulley 30 and the driven pulley 28 as shown. The carrier band 22 is connected to the carrier block 16 through, for example, a connector 34 that includes posts 36 and 38 to which the carrier band 22 can be secured under tension. The drive pulley 30, as explained below in relationship to FIGS. 13, 13A and 16, is connected to a bi-directional drive motor (not shown in FIG. 3) so rotation of the drive pulley 30 in one direction or the other will cause corresponding linear motion of the carrier block 16 and its wand $W_1$ relative its guide rail G1. While not shown in FIG. 3, the wand $W_2$ is connected to and controlled by a drive train corresponding to that shown for the wand $W_1$. While a flexible band drive has been shown as the preferred embodiment, a wire-drive is likewise suitable as are various types of linear actuators.

Figure 4:
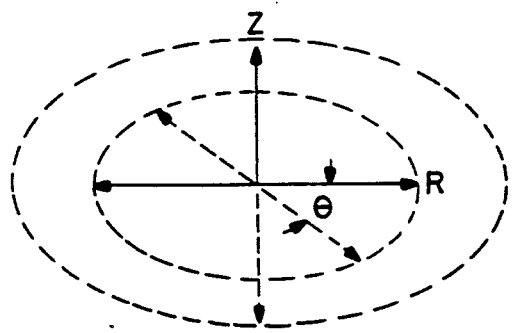
FIG. 4 illustrates the coordinate system convention in which the robotic handling system of the present invention functions.

The wand assembly 10 operates within a coordinate system as shown in FIG. 4 and which includes the vertically aligned Z axis and the generally horizontal R axis. The wand assembly 10 is angularly rotatable about the Z axis with the angle of rotation defined as $\theta$. Since the wands $W_1$ and $W_2$ are operative between their respective initial and extended positions, the wands $W_1$ and $W_2$ will sweep an area between the dotted-line ellipses in FIG. 4. Since, as explained below, the wand assembly 10 can be elevated along the Z axis, the wand assembly 10 has an effective operating envelope that can be defined as an annular cylinder, into which operating envelope various work stations and wafer supply and destination cassettes are positioned.

As can be best appreciated from FIGS. 2 and 3, the wands $W_1$ and $W_2$ are 'offset' mounted relative to the R axis and each other. More specifically and as shown in FIG. 3, the wand $W_1$ includes an end effector distal portion 40 that overlies and is coincident with the reach axis R. A proximate portion 42 is connected to its carrier block 16 and is connected to the distal portion 40, in the case of the preferred embodiment, by an intermediate cross-over or offset portion 44 extending at an angle of approximately 120° relative to the R axis. As can be appreciated, other angular relationships that achieve the intended purpose are likewise suitable. The wand $W_2$ is similarly constructed so that each wand provides its end effector along the reach axis R and yet the main structural portions of each wand are not mounted on the reach axis R but adjacent to the reach axis. The proximate portion of each wand is at a different elevation, e.g., lower, than the distal portion of the adjacent wand to avoid conflicting with a wafer on the latter.

The 'offset' wand configuration described above permits a relatively compact wand assembly 10 having a desirably short dimension along the reach axis R and which can provide two independently operated end effectors that lie on the reach axis R. While the preferred configuration of each wand $W_1$ and $W_2$ is 'offset' so that the end effectors operate on the 'R' axis, as can be appreciated the end effectors can be configured to lie adjacent to the 'R' axis.

Figure 5:
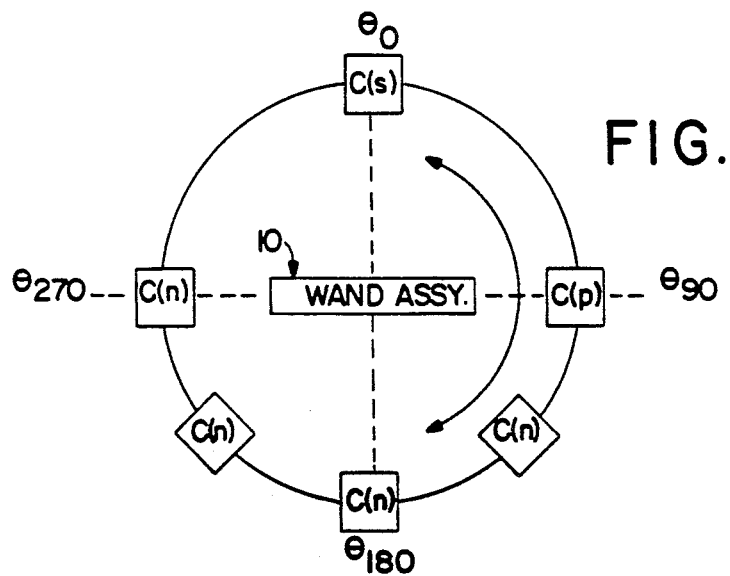
FIG. 5 is a symbolic top view representation of a generalized wafer transfer environment for subjecting a wafer to a process step and transferring the just-processed wafer to one-of-n destination cassettes.

The functional advantages of the compact wand assembly 10 with offset end effectors in providing increased throughput can be best appreciated by a consideration of FIG. 5 which is a symbolic top view representation of a typical process station arrangement in which a supply cassette $C_{[s]}$ is positioned at $\theta_0$ and contains a supply of discoidal wafers S that are to be removed from the supply cassette $C_{[s]}$ on a one-at-a-time basis and transported to a process station $C_{[p]}$ at position $\theta_{90}$. After the inspection process is completed, the inspected wafer S is then transported to one of n destination cassettes $C_{[n]}$ at various positions about the area swept by the wand assembly 10. Since the various cassettes contain a plurality of wafers S in a spaced parallel relationship, the wand assembly 10 is raised or lowered along its Z axis to the proper elevation.

It will be appreciated that during wafer processing it is necessary to free an end effector before it can be used to pick up a new wafer. With the present invention, one can use the other end effector (assuming it is free) to pick up a new wafer and still have a free end effector to pick up the processed wafer. Since the effectors are independently operable, translational movement of one end effector does not result in a wafer on the other end effector being affected.

The robotic handling system of the invention includes a quite compact arrangement for raising and lowering the wand assembly 10. Such arrangement and its relationship to the wand assembly 10 is illustrated in FIGS. 7 through 12 and FIG. 13A. A pair of lead screw drive assemblies 50 and 52 are mounted at the exterior of column 14 for raising and lowering the same. Each of such drive assemblies respectively includes a lead screw 54 and 56 extending generally parallel to the Z axis and journalled for rotation between a baseplate 58 and an intermediate flange 60 extending radially from an upper housing collar 62.

An annular plate 63 is secured to the top of the housing 62 to facilitate mounting of the structure. Each of the lead screws with its corresponding nut 65 preferably is of the anti-backlash type.

As illustrated, the support column includes an outer canister 64 that has an inner canister 66 rotatably mounted therein via a bearing assembly that includes a bearing set 68 retained in place with a retainer ring 70, with a mounting flange 71 connecting base plate 12 of the wand assembly to the inner canister 66 so that the wand assembly 10 can rotate about the Z axis relative to the support column 14.

It will be appreciated by those skilled in the art that in a robot handling system it is desirable in general that a lead screw or other type of drive for a support column or the like be coaxial with the axis along which the column is to be driven. That is, it is desirable that the driving mechanism not be offset or cantilevered relative to the driving axis. In this particular situation, this would mean either that a lead screw drive would be located within the support column or alternatively along the Z axis above or below such column. This, however, does not lend itself to a compact arrangement. In this connection, compactness in the Z axis direction is often particularly important since in many situations space in such direction is at a premium.

The driving mechanism for the column of the invention facilitates movement of the support column without requiring the drive to be located on the Z axis. That is, it has been found that a plurality of drives as illustrated can be used to move the column along the Z axis as long as a coupling is included to assure that differential application of forces by the individual drives urging movement of the column are accommodated. This is counter-intuitive in the sense that more (a plurality of drives) means less (space saving).

In the preferred embodiment the lead screw assemblies 50 and 52 are on opposite sides of the column and define a common plane with the Z axis. Such drives are connected together via the nuts 65 by a bridge 72 which extends across the Z axis. In this connection, it passes through opposed slots 74 in the support column 14. The design of the bridge itself is selected to minimize the space required in the Z axis direction adjacent the end of the handling system. The central portion of the bridge is lower to be adjacent the end of the column even though the end portions are higher to be connected to the lead screw nuts 65.

Figure 8:
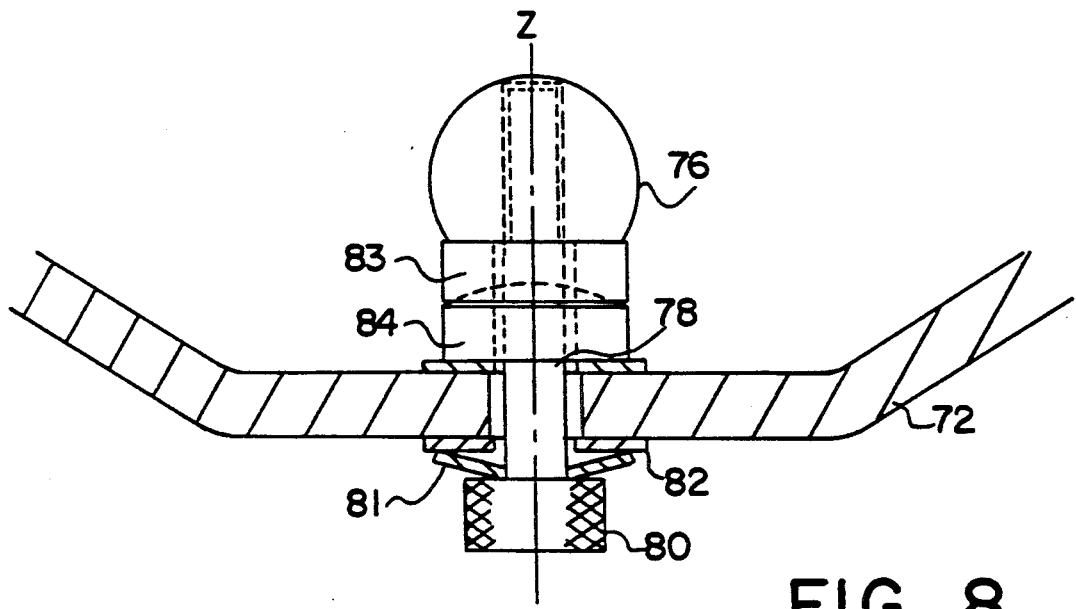
FIG. 8 is an enlarged partial view of that portion of the mechanism indicated by the encircling line 8—8 in FIG. 7.
Figure 10:
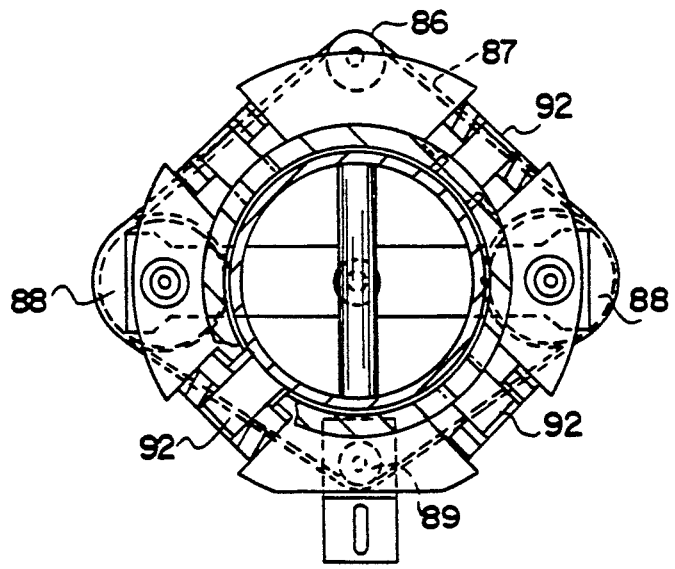
FIG. 10 is a sectional view taken on the plane indicated by the lines 10—10 in FIG. 7, with selected components omitted for reasons of clarity.

The bridge is connected to the support column at the Z axis via a cross-bar 76. As illustrated, such cross-bar is orthogonal to the bridge 72 and is connected thereto by means of a coupling construction which enables universal movement between the bridge 72 and such cross-bar. FIG. 8 provides an enlarged view of such construction. A bolt 78 extends from the bar 76 through bridge 72 to a nut 80. Nut 80 captures a spring washer 81 against a suitable hard washer 82 at the underneath side of bridge 72. This structure enables limited axial motion in the coupling to be accommodated.

A swivel washer made up of female and male components 83 and 84, respectively, are positioned on the bolt 78 between bar 76 and bridge 72. As will be recognized by those skilled in the art, such washer will permit limited universal motion of the bridge 72 relative to the bar 76. Thus, if the forces applied to the bar 76 by the lead screw drives 50 and 52 are uneven, the coupling described will assure that such unevenness is not transmitted to the column 14. Moreover, if there is a lead error in one of the drives relative to the other, the amount of such lead error will be halved assuming, of course, that the coupling is one-half of the distance between such lead screw assemblies. The provision of a plurality of drives in the manner described results, therefore, in greater accuracy, i.e., the lead error effect is reduced.

It will be recognized that the connection between the bar and the support column 14 could be designed to enable relative rotation. If such an arrangement is provided, it then will be unnecessary that the physical coupling between the bridge and the bar accommodate rotation of the latter. Moreover, in some situations it is not necessary that a full universal coupling be provided—it is only necessary that the coupling accommodate any expected differential application by the drives of forces urging the column to move along the Z axis.

Figure 9:
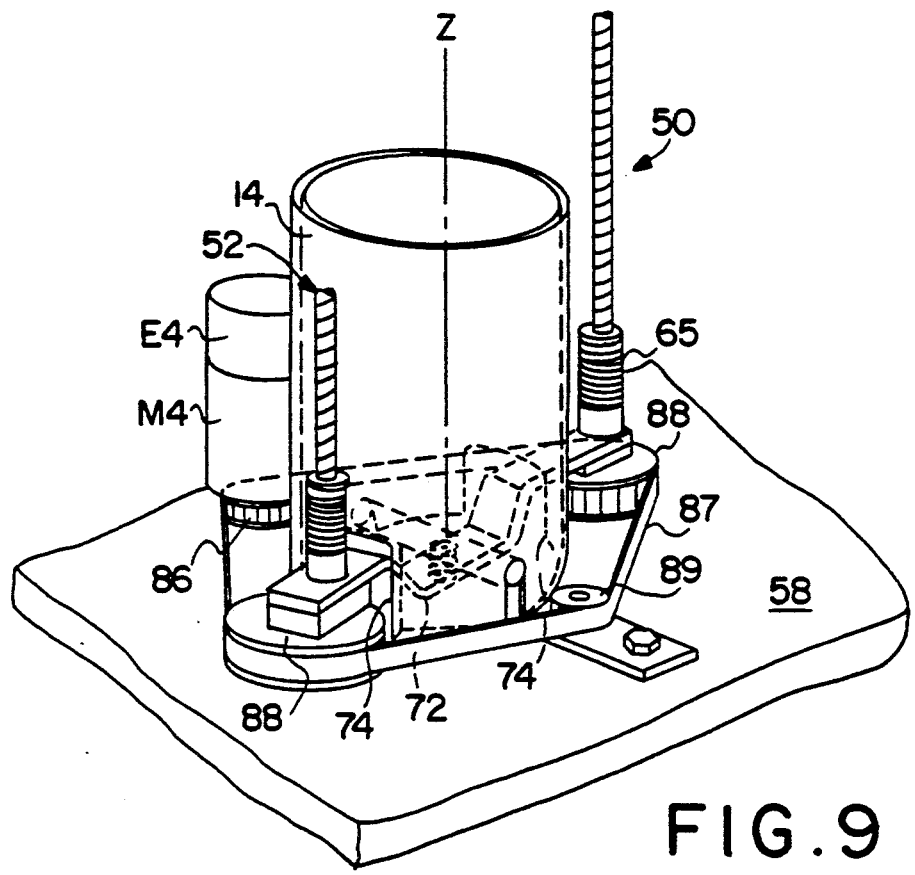
FIG. 9 is a partial isometric view illustrating the lower portion of the support column and its drives.
Figure 11:
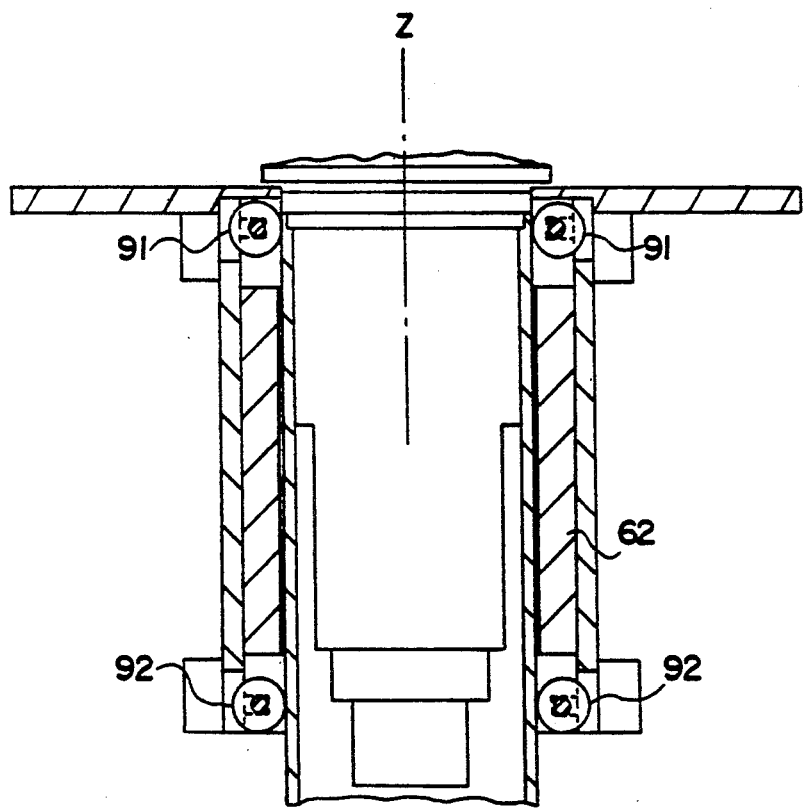
FIG. 11 is a view of the upper portion of the support column rotated 45 degrees from the view of FIG. 7.
Figure 12:
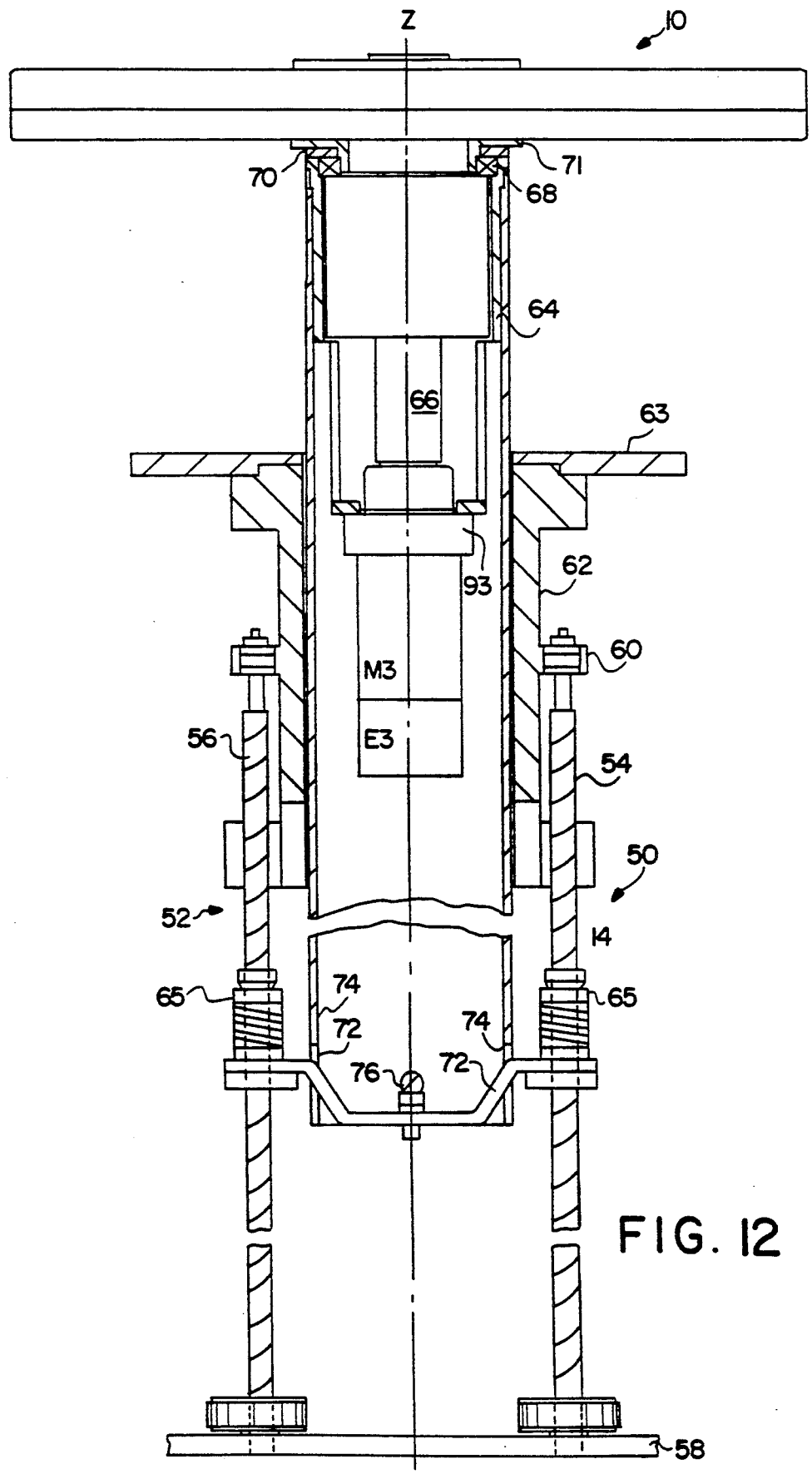
FIG. 12 is another sectional view similar to FIG. 7 illustrating the wand assembly in a raised position.

Reference is made to FIG. 9 for an understanding of the manner in which the lead screw drive assemblies 50 and 52 are actuated. A bi-directional motor M4 rotates a drive pulley 86 which in turn drives an actuator 87 which passes around pulleys 88 drivingly secured (not shown) to the respective lead screws 54 and 56. An idler pulley 89 is also included opposite drive pulley 86 to complete the drive circuit. Bi-directional motor M4 is controlled by a shaft encoder E4 which is essentially the same as the shaft encoders described for the other motors. Column 14 is guided in its movement by a spaced roller arrangement which minimizes wobble and the like about the Z axis. This arrangement is illustrated in FIG. 11 which is a sectional view at the housing collar 62 that is rotated by 45 degrees from the sections of FIGS. 7 and 12. As can be seen from this figure and FIG. 10, four guide rollers 91 are spaced in the direction of such axis from another set of such guide rollers 92. This provision of two sets of guide rollers spaced from one another in the direction of the axis eliminates the possibility of one set thereof acting as a pivot plane for wobbling of the column. In other words, it improves the accuracy of the arrangement. It will be appreciated that the guide rollers can be spring loaded against the column and their positions adjusted to provide the amount of resistance which is desired to movement of the column.

Column 14 is preferably a hollow cylinder which houses many of the components of the invention. This can best be appreciated by reference to the exploded perspective views of FIGS. 13 and 13A. With respect to such views, the selected components are omitted for reasons of clarity. The wand assembly 10 is carried atop and rotatably mounted on the support column 14 with the wands $W_1$ and $W_2$ controlled by respective motors M1 and M2 located on the column. Each of such motors carries a respective tail-mounted shaft encoder E1 and E2. The motors M1 and M2 include upwardly extending shafts upon which the drive pulleys 30 are mounted so that bi-directional rotation of the pulleys 30 causes the respective wands to extend or retract. The shaft encoders E1 and E2 provide position output information to the controller of FIG. 16, as described below, to accurately position the wands $W_1$ and $W_2$. The motors M1 and M2 are carried in the inner canister 66 which is rotated relative to the support column 14 by a motor M3 that is secured in the column to the lower end of the outer canister by a motor mount 93 which can include a flex coupling and a reduction mechanism 58. An encoder E3 is connected to the motor M3 and provides $\theta$ angle information to the controller of FIG. 16.

The robotic handling system of the invention is operated under the control of the below described controller in FIG. 16 in accordance with the flow diagrams of FIGS. 14 and 14A in the context of FIG. 5 or FIGS. 15 and 15A in the context of FIG. 6 to effect handling and transfer of the wafers S. More specifically and as shown in the flow diagram of FIGS. 14 and 14A, the system is initialized (step 1) by rotating the wand assembly 10 about the Z axis so that the reach axis R is aligned in the $\theta_0$ to $\theta_{180}$ direction with the wand $W_1$ in its home position facing the supply cassette $C_{[s]}$. The wand $W_1$ is then extended and raised (steps 2, 3, and 4) to engage a wafer $S_n$ from the supply cassette $C_{[s]}$ and returned to its home position with the wafer $S_n$ attached to its end effector 40. As part of the removal of the wafer $S_n$, the elevation of the wand assembly 10 is controlled so that the end effector 40 extends just beneath (step 2) the underside of the wafer $S_n$ and the wand assembly 10 is then elevated (step 3) slightly to effect physical contact with the wafer $S_n$ as the vacuum system is enabled. The wand assembly 10 is then elevated again slightly, and the wand $W_1$ and the attached wafer $S_n$ are retracted (step 4). The wand assembly 10 is then rotated clockwise in FIG. 5 to align the reach axis R along the $\theta_{90}$ to $\theta_{270}$ direction with the wand $W_1$ pointing to the process station $C_{[p]}$ and the wand $W_2$ pointing in the opposite direction. The wand $W_1$ is then extended from its home position and the elevation and the vacuum system controlled (step 6) to deposit the wafer $S_n$ at the process station $C_{[p]}$ where the process step is initiated (step 7) for the wafer $S_n$. During the time period the process step is in progress, steps 1–4 are repeated so that the next successive wafer $S_{n+1}$ is retrieved by the wand $W_1$ (step 8). The wand assembly 10 is rotated (step 9) to position the empty wand $W_2$ at the process station $C_{[p]}$ and the wand $W_1$ with the next-successive wafer $S_{n+1}$ opposite the process station $C_{[p]}$.

At the conclusion of the process step (step 10), the empty wand $W_2$ is extended and the elevation of the wand assembly 10 and the vacuum system are controlled to engage and retract the just-processed wafer $S_n$ (step 11). The wand assembly 10 is then rotated about the Z axis to align the wand $W_1$ with the next-successive wafer $S_{n+1}$ at the process station $C_{[p]}$ (step 12). The wand $W_1$ is extended (step 13) to position the next successive wafer $S_{n+1}$ at the process station $C_{[p]}$, and the process is initiated (step 14) for the next-successive wafer $S_{n+1}$. The wand assembly 10 is then rotated (step 15) to align the wand $W_2$ and its just-inspected wafer $S_n$ with the appropriate destination cassette $C_{[n]}$, and the wand $W_2$ extended (step 16) to place the just-processed wafer $S_n$ into the appropriate destination cassette $C_{[n]}$. Thereafter the process is continued by repeating steps 9 through 17 until all the wafers in the supply cassette $C_{[s]}$ are processed.

Figure 14:
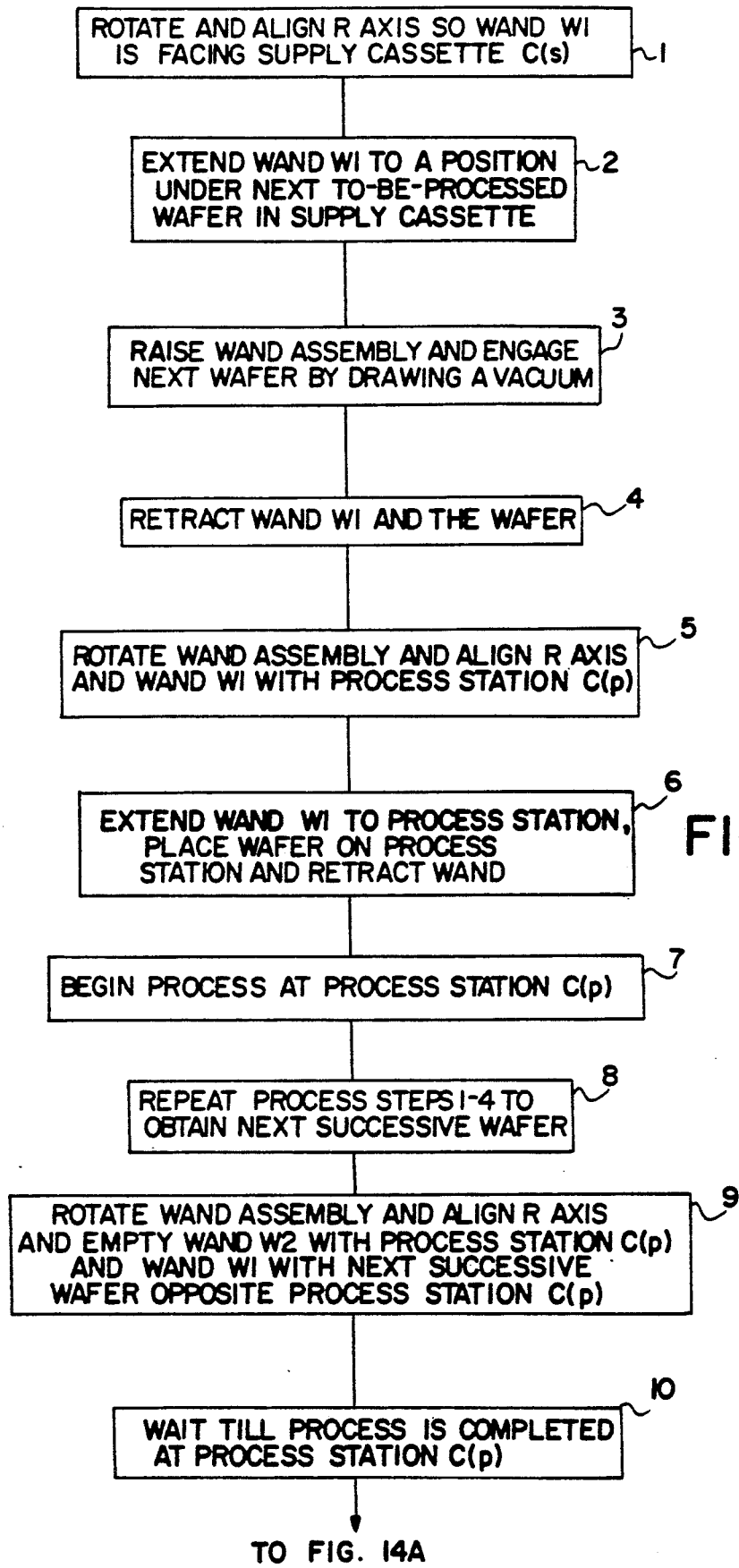

The sequence of operation of FIGS. 14 and 14A illustrates the concept of 'quick hand-off' in which the next successive wafer $S_{n+1}$ is always available for processing immediately after the completion of the processing of the preceding wafer $S_n$. This increases throughput.

Figure 6:
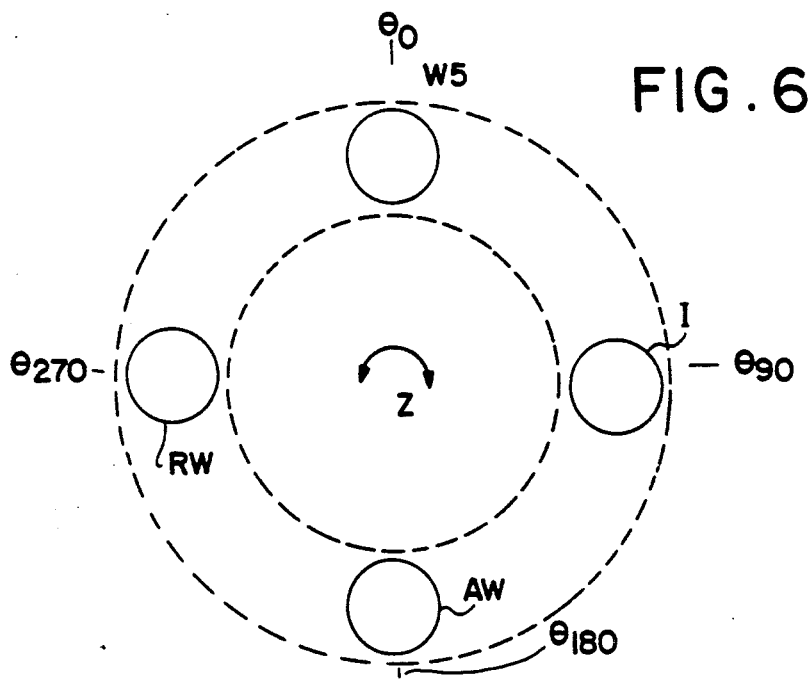
FIG. 6 is a symbolic top view representation of a wafer transfer environment for inspecting or processing a wafer and presenting the just-inspected wafer to an accepted-wafer cassette or to a rejected-wafer cassette.
Figure 7:
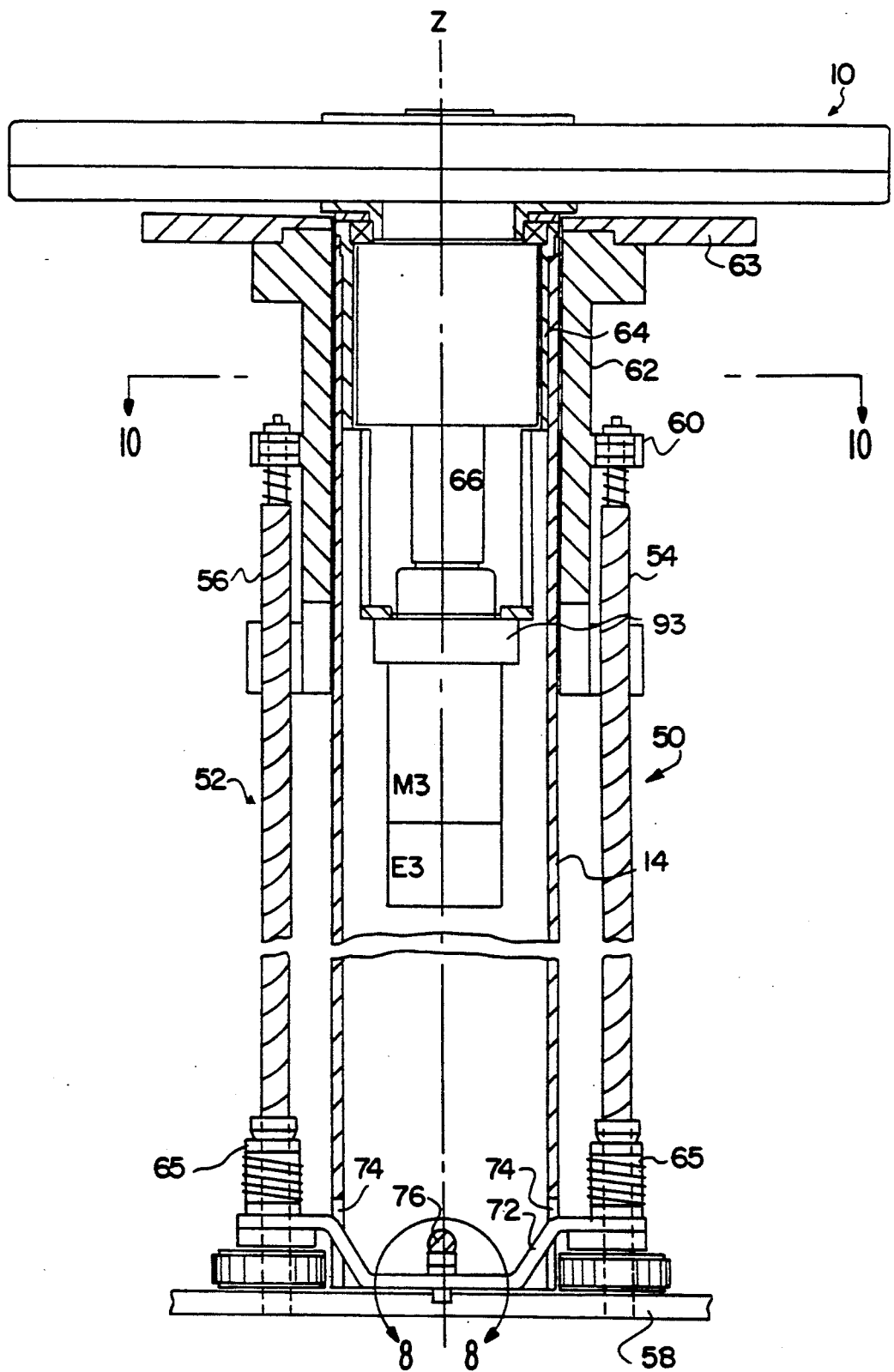
FIG. 7 is an elevation view partly in section showing the support column and its drives, with selected components omitted for reasons of clarity.
Figure 15:
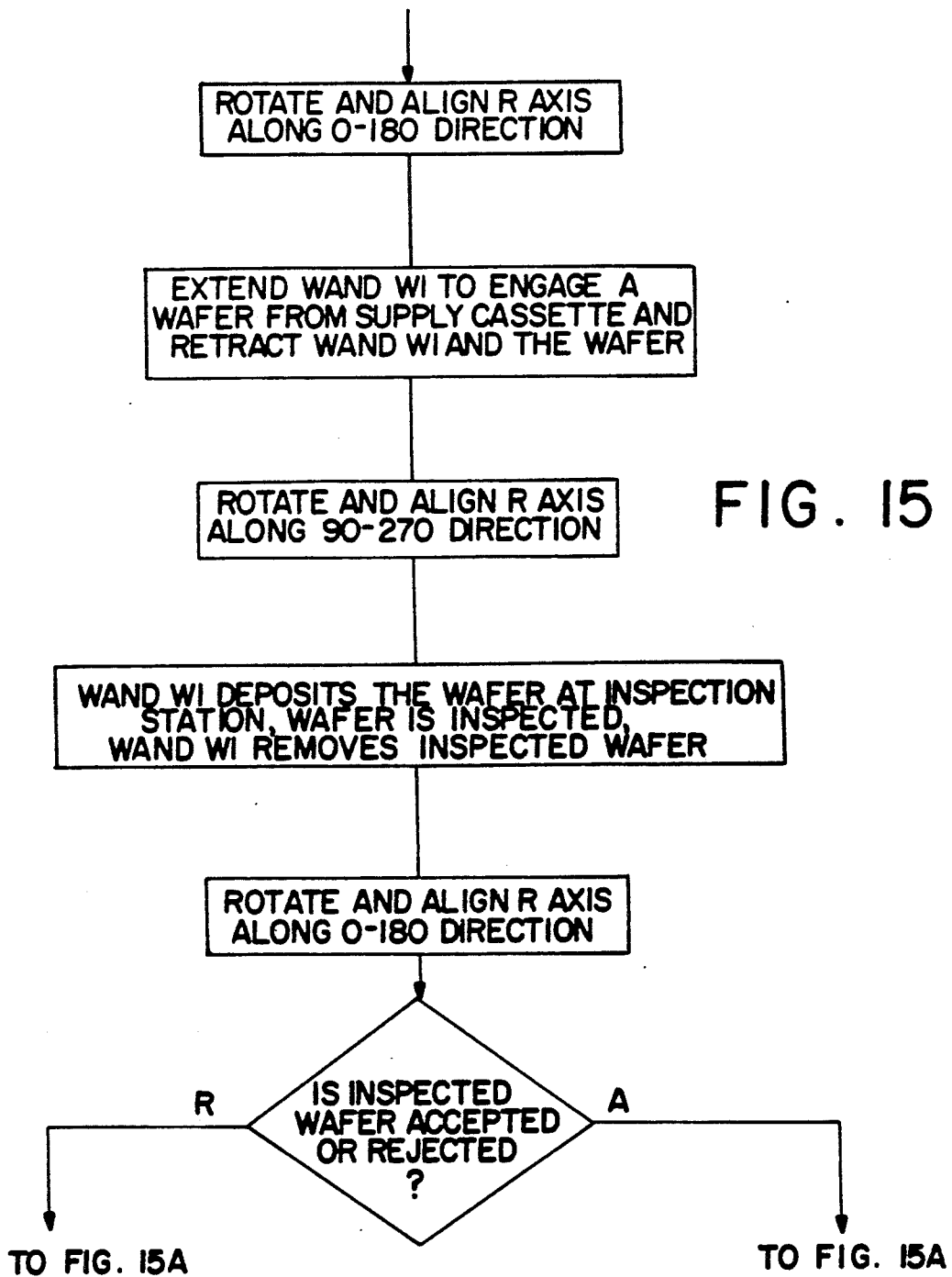
FIGS. 15 and 15A are a functional flow diagram illustrating a second sequence of operation of the robotic handling system in the context of FIG. 6.
Figure 15A:
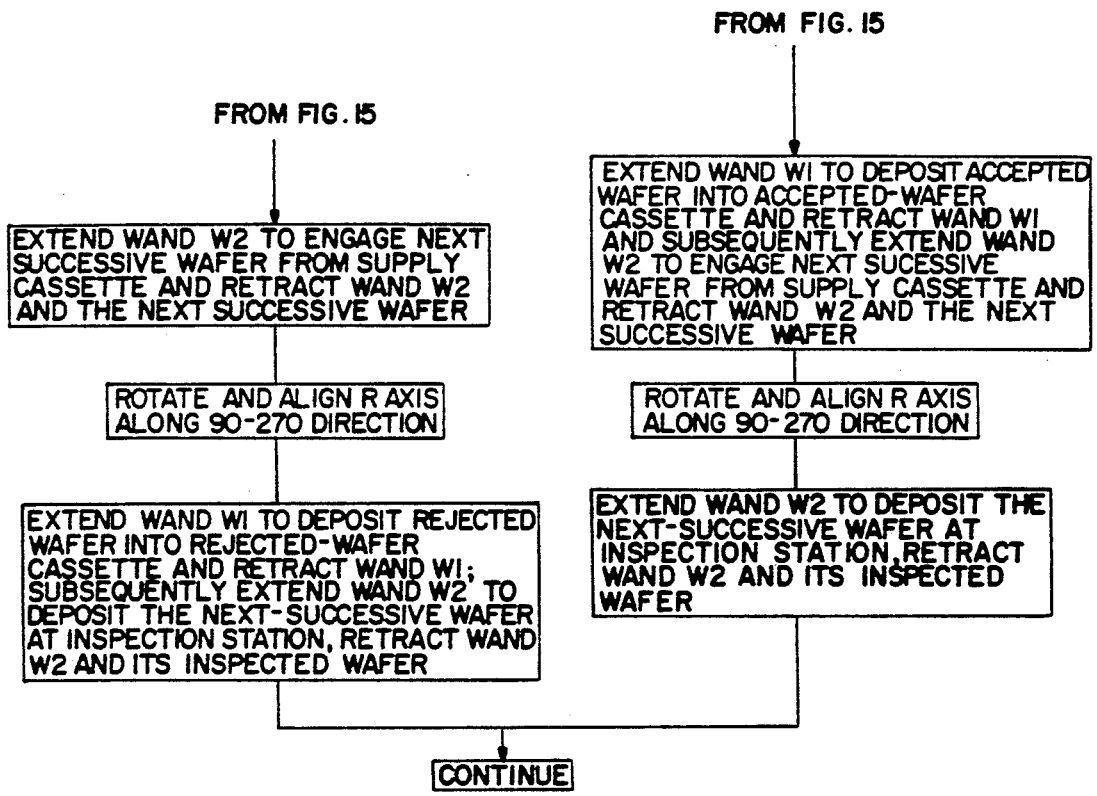

Additional functional advantages of the robotic handling system in providing increased throughput can be further appreciated by a consideration of FIG. 6 and FIGS. 15 and 15A. More specifically, the system is initialized by rotating the wand assembly 10 about the Z axis so that the reach axis R is aligned in the $\theta_0$ to $\theta_{180}$ direction with the wand $W_1$ in its home position facing the supply cassette WS and the wand $W_2$ in its home position facing the accepted-wafer cassette AW. The wand $W_1$ is then extended to engage a wafer $S_n$ from the supply cassette WS and return to its home position with the wafer $S_n$ attached to its end effector 40. As part of the removal of the wafer $S_n$, the elevation of the wand assembly 10 is controlled so that the end effector 40 extends just beneath the underside of the wafer $S_n$ and the wand assembly 10 is then elevated slightly to effect physical contact with the wafer $S_n$ as the vacuum system is enabled. The wand assembly 10 is then elevated again slightly, and wand $W_1$ and its attached wafer $S_n$ are retracted. The wand assembly 10 is then rotated clockwise in FIG. 6 to align the reach axis R along the $\theta_{90}$ to $\theta_{270}$ direction with the wand $W_1$ pointing to the work station I and the wand $W_2$ pointing to the rejected-wafer cassette RW. The wand $W_1$ is then extended from its home position and the elevation and the vacuum system controlled to deposit the wafer Sn at the work station I where the wafer Sn is subjected to a process step, for example, optical inspection by a human operator or an inspection machine. During the inspection step, the wand $W_1$ is retracted to its home position. At the conclusion of the inspection step, the wand $W_1$ is again extended and the elevation of the wand assembly 10 and the vacuum system controlled to engage the wafer $S_n$ and retract the just-inspected wafer $S_n$. The wand assembly 10 is then rotated about the Z axis to align the reach axis R in the $\theta_0$ to $\theta_{180}$ direction with the wand $W_1$ and its just-inspected wafer $S_n$ pointing to the accepted-wafer cassette AW and the wand $W_2$ pointing to the supply cassette WS.

Assuming the wafer $S_n$ has passed its inspection step, as contrasted to the handling of a rejected wafer $S_n$ as discussed below, the wand $W_1$ and the wafer $S_n$ are extended and the elevation and vacuum system controlled to deposit the just-inspected and accepted-wafer $S_n$ in the accepted-wafer cassette AW. In addition, the wand $W_2$ is also extended to retrieve the next successive wafer $S_{n+1}$ to be inspected. As can be appreciated, the extension of the wands $W_1$ and $W_2$ can occur in the reverse order of that described. The wand assembly 10 is then rotated clockwise in FIG. 6 to align the reach axis R along the $\theta_{90}$ to $\theta_{270}$ direction with the wand $W_2$ and the next successive wafer $S_{n+1}$ pointing to the work station I and the wand $W_1$ pointing to the rejected-wafer cassette RW. The wand $W_2$ is then extended from its home position and the elevation of the wand assembly 10 and the vacuum system controlled to deposit the wafer $S_{n+1}$ at the work station I where the wafer $S_{n+1}$ is subjected to the process step with the wand $W_2$ retracted to its home position. At the conclusion of the inspection step, the wand $W_2$ is again extended and the elevation of the wand assembly 10 and the vacuum system controlled to engage and retract the just-inspected wafer $S_{n+1}$.

In the event the initially inspected wafer $S_n$ was rejected (i.e., did not pass its inspection step in contrast to the accepted-wafer condition discussed above), the wand $W_2$ is extended to retrieve the next successive wafer $S_{n+1}$ to be inspected from the supply cassette WS while the rejected wafer $S_n$ remains on the wand $W_1$ adjacent the accepted-wafer cassette AW. The wand assembly 10 is then rotated clockwise in FIG. 6 to align the reach axis R along the $\theta_{90}$ to $\theta_{270}$ direction with the wand $W_2$ and the next successive wafer $S_{n+1}$ pointing to the work station I and the wand $W_1$ and its rejected wafer $S_n$ pointing to the rejected-wafer cassette RW. The wand $W_1$ is then extended from its home position and the elevation of the wand assembly 10 and the vacuum system controlled to deposit the rejected wafer $S_n$ in the rejected-wafer cassette RW. Additionally, the wand $W_2$ and the next successive wafer $S_{n+1}$ are extended from the home position to deposit the next successive wafer $S_{n+1}$ at the work station I where the wafer $S_{n+1}$ is subjected to the process step. As can be appreciated, the extension of the wands $W_1$ and $W_2$ can occur in the reverse order of that described. The wand assembly 10 is then rotated clockwise in FIG. 6 to align the reach axis R along the $\theta_0$ to $\theta_{180}$ direction with the wand $W_1$ pointing to the supply cassette WS and the sequence continued in a recurring manner.

While the wand assembly 10 has been described as rotated in the clockwise direction in the context of FIG. 6, as can be appreciated, the wand assembly 10 can also be rotated counter-clockwise to achieve its intended function. The configuration of the wand assembly 10 in providing two offset wands $W_1$ and $W_2$ aligned along the reach axis R provides for a significant functional advantage over prior systems that employ, for example, a single wand aligned along the reach axis R.

The various motors and the vacuum system of the robotic handling system are operated by a controller 100 shown in schematic form in FIG. 16. As shown, the controller 100 includes a microprocessor 102 that operates in response to instructions stored in a memory 104 communicating with the microprocessor 102 through a bus 106. The memory contains both read-only memory (ROM) and random-access memory (RAM). An user interface 108, including input and output ports, is coupled to the microprocessor 102 through a bus 110 and accepts user input commands and provide output information and data. An input/output port 112 interfaces with the microprocessor 102 through a bus 114 to effect control of the various motors M1-M4, the respective encoders E1-E4, and the vacuum systems for the wands $W_1$ and $W_2$ in accordance with the exemplary flow diagrams of FIGS. 14 and 14A or FIGS. 15 and 15A to achieve the desired function. A clock 116 provides timing signals to the microprocessor 102 to effect system timing.

The present invention advantageously provides a robotic handling system having increased throughput and design flexibility in a desirably reduced-size operating envelope. The wand assembly always has two wands aligned along the reach axis R with both wands independently operable so that one wand handles a first wafer and the other wand handles either the just-processed wafer or the next successive wafer. The construction of the wands reduces the size of the operating envelope along the reach axis R. The support column drive arrangement cooperates with such wand assembling to provide an especially compact precision robotic handling system.

As will be apparent to those skilled in the art, various changes and modifications may be made to the illustrated robotic handling system of the present invention without departing from the spirit and scope of the invention as determined in the appended claims and their legal equivalent. For example, although the handling system is designed for rotation on the support column between stations, the wand assembly also could be advantageously used in a system relying on linear motion between stations.

What is claimed is:

1. In a robotic handling system for transferring semiconductor wafers from one position to another, the combination comprising:
   wand assembly means having first and second end effectors mounted thereon for individual guided movement along the same axis, which wand assembly means comprises:
   a mounting plate having first and second guideways thereon extending parallel to said axis;
   first and second carriers in sliding engagement with respective ones of said first and second guideways, said first and second end effectors being connected, respectively, to said first and second carriers and each of said end effectors comprising a first portion aligned parallel to and spaced from the first-mentioned axis, an end portion extending along the first-mentioned axis, and an intermediate portion extending between said first and end portions;

first drive means for separately driving said first and second end effectors to extend or retract said first end effector with respect to a first direction along said axis and to extend or retract said second end effector with respect to a second direction along said axis; said drive means comprising for each of said carriers, a flexible and elongated power transmitting driver connected respectively between first and second rotatable following and driving pulleys, said driving pulley being connected to a drive motor through a third pulley and a second driver connected between said drive motor and at least one of said first and second-mentioned pulleys; and second drive means for rotating said wand assembly means about a second axis which is generally perpendicular to the first-mentioned axis.

2. The robotic handling system of claim 1, wherein each of said guideways comprises an elongated parallelpiped having its long axis aligned parallel to the first-mentioned axis.

3. The robotic handling system of claim 1, wherein said first drive means comprises for each of said end effectors, an electric motor providing drive power and an encoder for providing encoded signal information representative of the relative position of said effector along said first-mentioned axis.

4. The robotic handling system of claim 3, further comprising:

stored-program controlled processor means for controlling each of said motors responsive, in part, to the encoded signal information.

* * * * *